United States Patent [19]

Capps et al.

[11] Patent Number: 5,150,182
[45] Date of Patent: Sep. 22, 1992

[54] SEMICONDUCTOR DEVICE ENHANCED FOR OPTICAL INTERACTION

[75] Inventors: C. David Capps, Seattle; R. Aaron Falk, Renton, both of Wash.

[73] Assignee: The Boeing Company, Seattle, Wash.

[21] Appl. No.: 203,726

[22] Filed: Jun. 7, 1988

[51] Int. Cl.$^5$ .................... H01L 27/14; H01L 31/00; H01L 27/01; H01L 29/00
[52] U.S. Cl. ...................................... 357/30; 357/23.1
[58] Field of Search ................ 357/30 L, 30 PF, 30 P

[56] References Cited

U.S. PATENT DOCUMENTS 3,210,622  10/1965  Gradus .............................. 357/30 P

FOREIGN PATENT DOCUMENTS

| 0039020 | 4/1981 | European Pat. Off. ........... 357/30 L |
| 7610162 | 12/1976 | France . |
| 53-121494 | 10/1978 | Japan ................................ 357/30 L |
| 57-024573 | 2/1982 | Japan ............................ 357/30 PF |
| 60-088482 | 5/1985 | Japan ................................ 357/30 L |
| 2164492 | 8/1985 | United Kingdom .............. 357/30 L |

OTHER PUBLICATIONS

"Electrooptic Sampling in GaAs Integrated Circuits" by Kolner et al, IEEE Journal of Quantum Electronics, vol. QE-22, No. 1, Jan. 1986.

"Noninvasive Sheet Charge Density Probe for Integrated Silicon Devices", by Heinrich et al., Applied Physics Letter 48(16), Apr. 1986.

Primary Examiner—Andrew J. James
Assistant Examiner—D. Monin
Attorney, Agent, or Firm—Foley & Lardner

[57] ABSTRACT

A semiconductor device is disclosed in which a long interaction path length is provided for a non-invasive probe beam. In a preferred embodiment, mirror surfaces are etched in the surface of the semiconductor substrate which are used to reflect the probe beam along the longest dimension of a charge carrier region of the semiconductor device. Interaction between the probe beam and the charge carriers present in the region is thereby enhanced.

7 Claims, 3 Drawing Sheets

SEMICONDUCTOR DEVICE ENHANCED FOR OPTICAL INTERACTION

BACKGROUND OF THE INVENTION

The invention is related to semiconductor devices in which a lengthened optical interaction beam path is provided to enhance interaction of a probe beam and charge carriers present in a carrier region of the devices.

Recently, noninvasive optical techniques have been developed for probing integrated circuit devices. These techniques are based on the phenomenon that if semiconductor material (for example GaAs and Si) is probed by an optical probe beam having a wavelength outside the absorption band of the material, any charge carriers present in the area probed will cause a change in the phase and/or polarization of the probe beam. (See, for example, J. L. Freeman et al Appl. Phys. Lett. 47, 1083 (1985), B. H. Kolner et al, "Electro-optic Sampling in GaAs Integrated Circuits", IEEE Journal of Quantum Electronics, Vol. QE-22, 79 No. 1, January 1986 and H. K. Heinrich et al, "Noninvasive Sheet Charge Density Probe for Integrated Silicon Devices", Applied Physics Letter 48(16), pp 1066–1068, Apr. 21, 1986.) The change in the probe beam can be detected and used to determine if a charge is present, and accordingly, whether an electronic device—such as an FET—is activated or storing charge. A plurality of optical memory elements may be interconnected to form a random access memory array as described in the application of Aaron Falk entitled "Opto-Electronic Memory Device", Ser. No. 07/203,495 filed concurrently herewith and incorporated herein by reference.

In conventional semiconductor devices, the probe beam must enter the substrate of the device in a substantially perpendicular manner in order to probe the charge carrier region. The charge carrier region, however, usually consists of a long thin region parallel to the surface of the substrate. Thus, the probe beam passes through the shortest dimension of the charge carrier region limiting the interaction path length of the probe beam and the charge carriers.

SUMMARY OF THE INVENTION

The object of the present invention is to provide a semiconductor device in which a long interaction path length is provided for a non-invasive probe beam. In a preferred embodiment of the invention, mirrors are etched in the surface of the semiconductor substrate which are used to reflect the probe beam along the longest dimension of the charge carrier region. Interaction between the probe beam and the charge carriers present in the region is thereby enhanced.

BRIEF DESCRIPTION OF THE DRAWINGS

With the above as background, reference should now be made to the following drawings in connection with the detailed description of the preferred embodiment in which.

DESCRIPTION OF THE PREFERRED EMBODIMENT

Figure 1:
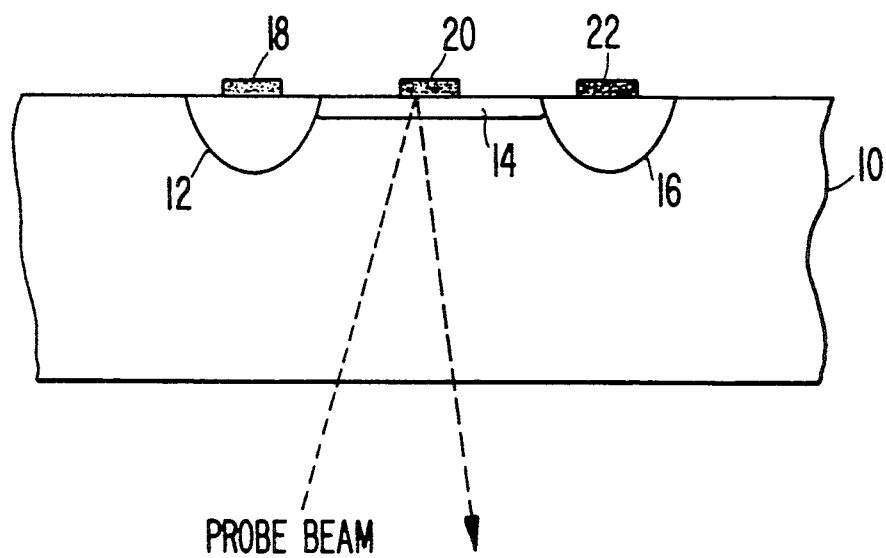
FIG. 1 is a cross-sectional diagram of a conventional FET.

Referring now to FIG. 1, a simplified cross-sectional view is provided of a conventional FET semiconductor device having a substrate 10, a source region 12, a carrier region 14, and a drain region 16. Corresponding source, gate, and drain electrodes 18, 20 and 22 are formed on the top surface of the substrate 10.

In order to utilize non-invasive techniques to probe the FET illustrated in FIG. 1, the probe beam enters the bottom surface of the substrate 10 and is reflected from the gate electrode 20. As is clearly shown, the probe beam (i.e. read beam) passes through the depth dimension of the carrier region 14, which is shorter than the length of the carrier region, thereby limiting interaction of the probe beam and any charge carriers present in the carrier region 14.

Figure 2:
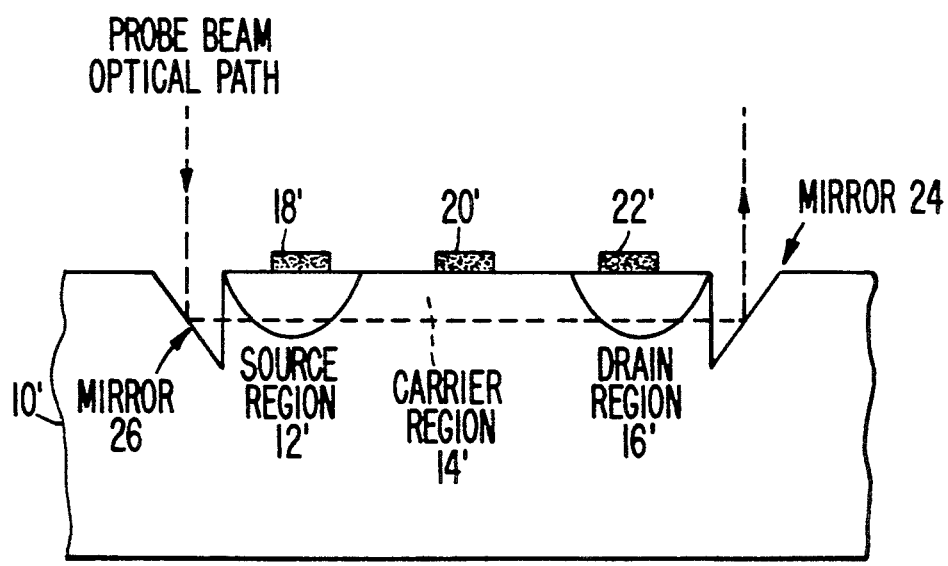
FIG. 2 is a cross-sectional diagram of an FET according to the present invention.

In a device in accordance with the present invention, however, optical interaction between the read beam and charge carriers is enhanced by extending the interaction path length of the device. In a preferred embodiment illustrated in FIG. 2, mirror surfaces 24 and 26 are formed in the surface of the substrate 10'. Conventional ion milling or etching techniques are employed to form the mirror surfaces 24 and 26 in substrate 10' so that the optical path of a probe beam applied to the device passes through the longest dimension of the charge carrier region 14'. In the case of the FET illustrated, the longest dimension is the length of the carrier region which is parallel to the top surface of the device. The mirror surfaces 24 and 26 may be formed in the substrate at various times in the production process, but are preferably formed after the deposition of the source region 12' and drain region 16'. The interaction length of the device shown in FIG. 2, therefore, is effectively extended over the conventional FET in which the read beam would enter the substrate perpendicular to the path of the charge carriers. It is clear that the optical path through the charge carrier region is advantageously selected to be at least approximately parallel to the top surface of the semiconductor device and traverses a distance through the charge carrier region which is substantially greater than the depth of the charge carrier region.

A semiconductor device according to the present invention may be employed in optical memory systems. For example, an optical flip-flop 28 (shown in FIG. 3) composed of two photo-FETs 30 and 32 that utilize the mirror surfaces 24 and 26 illustrated in FIG. 2, can be employed as an elemental memory device in a fully optical memory. One of the photo-FETs 30 is probed by a read beam to determine if charge is flowing through the device. The read beam has a wavelength outside the absorption band of the substrate. For example, in order to "store" a logic "1", a write beam activates photo-FET 30 causing current to flow through that photo-FET. Changes to the phase and/or polarization of the reflected read beam are then used to determine that photo-FET 30 is "ON" thereby indicating a "1" has been stored. In order to erase the "1" from memory (photo-FET 30), the write light is directed to photo-FET 32 causing photo-FET 30 to be switched "OFF". The write light has a wavelength within the absorption band of the substrate.

Figure 3:
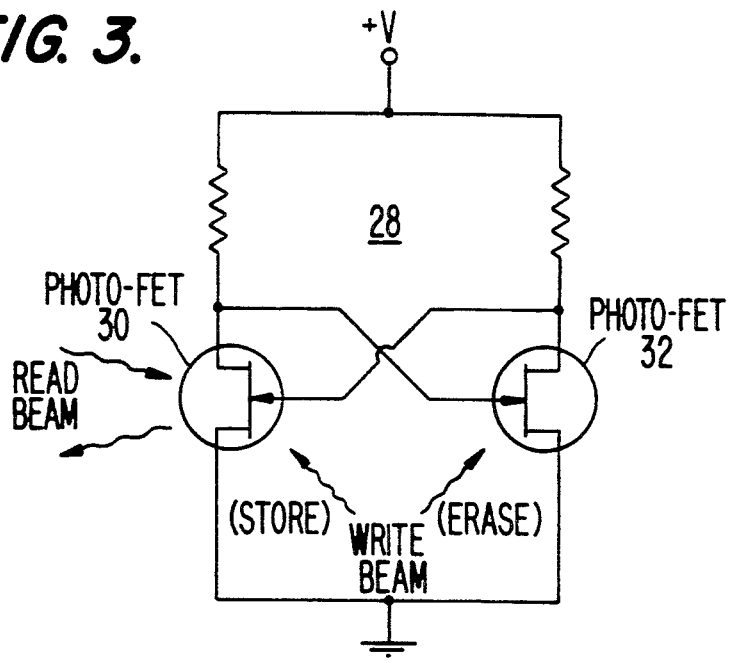
FIG. 3 is a schematic diagram of an optical memory element employing photo-FETs.
Figure 4:
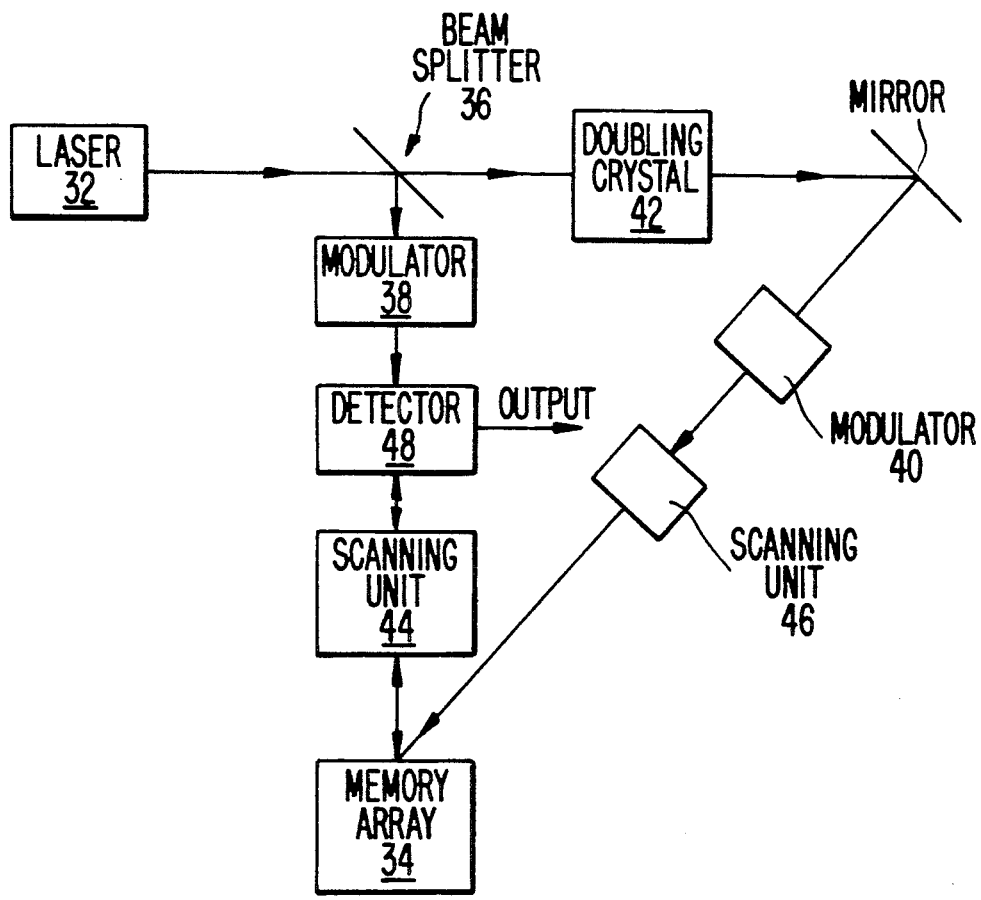
FIG. 4 is a block diagram of a system for scanning an optical memory device having an array of optical memory elements of the type shown in FIG. 3.

A memory array consisting of a plurality of the elemental memory devices illustrated in FIG. 3 can be formed using conventional solid state device fabrication techniques to form a fully optical random access memory. As shown in FIG. 4, a single yttrium aluminum garnet (YAG) laser 32 is utilized to provide a both the read beam and write beam used to address an optical random access memory array 34 made in GaAs. A beam splitter 36 splits the beam from the laser 32 into a read beam and a write beam which are supplied to modulators 38 and 40, respectively. The modulators 38 and 40 selectively block the read and write beams to effect "on-off" control of the beams. The frequency of the write beam, however, is first doubled by a doubling crystal 42 before being provided to the modulator 40. The wavelength of the write beam is preferably about 532 nm and the wavelength of the read beam is preferably about 1064 nm. Scanning units 44 and 46 then independently scan the modulated read and write beams across the memory array to selectively address the elemental memory devices for reading and writing, respectively.

A detector unit 48 analyzes phase and/or polarization changes in the reflected read beam in order to determine the charge density present in the area probed by the read beam. The detector unit 48 detects the index of refraction change resulting from charge modulation or through the electro-optic effect by employing a high resolution interferometer, noninvasive technique, such as disclosed in the above referenced paper by Heinrich et al entitled, "Noninvasive Sheet Charge Density Probe for Integrated Silicon Devices" the contents of which are incorporated herein by reference.

Figure 5:
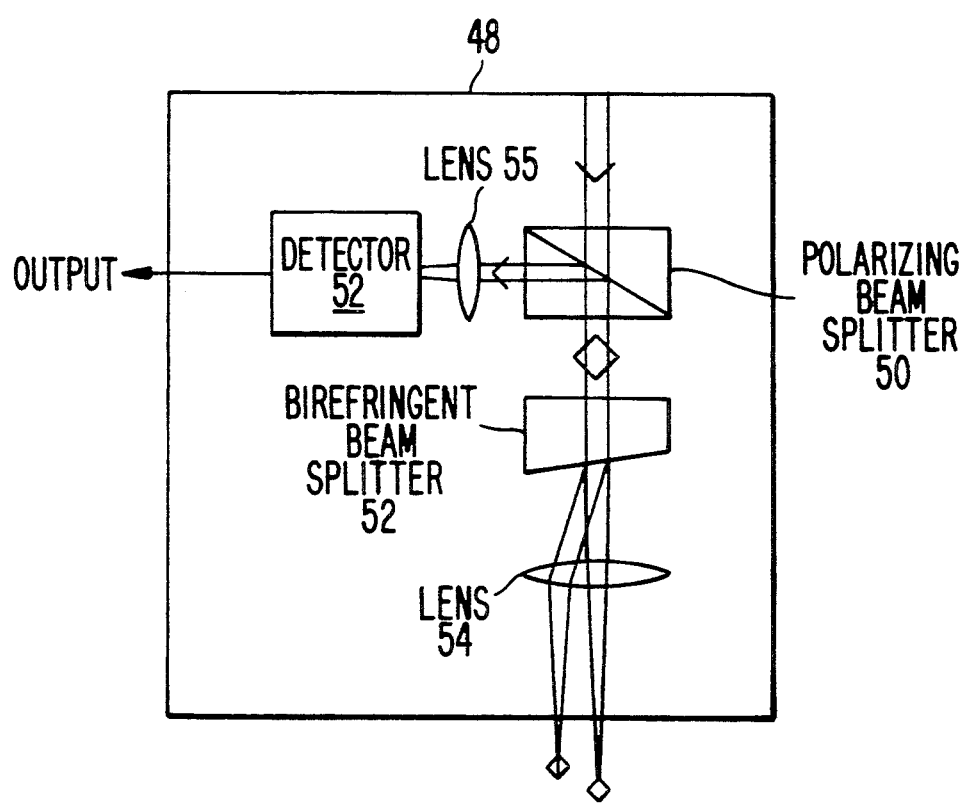
FIG. 5 is a block diagram of a detector unit employed in the system shown in FIG. 4.

Detector 48 is illustrated in FIG. 5. The read beam from modulator 38 is passed through a polarizing beam splitter 50 and then through a birefringent beam splitter 52 which produces two beams of orthogonal polarization. An objective lens 54 focuses the two beams, which are deflected by the scanner unit 44, onto the memory array 34. One beam passes through the active area of the memory array to be probed while the second beam is reflected from a metallized area of the memory array 34 serving as a reference point. By placing the birefringent beam splitter 52 and the memory array 34 at the back and front focal planes of the objective lens 54, the two beams are reflected back along the same optical path and are recombined into a single beam by the birefringent beam splitter 52. The polarizing beam splitter 50 and a lens 55 direct the reflected light to a photodetector circuit 56 which produces an intensity modulated interference product. The output of the photodetector circuit 56 provides an intensity modulated electrical signal which is linear wit respect to charge density.

The invention may also be employed in the parallel memory addressing array as disclosed in the above-referenced Falk application.

The invention has been described with reference to certain preferred embodiments thereof. It will be understood, however, that variations and modifications may be made within the spirit and scope of the invention. For example, the invention is not limited to the particular FET structure disclosed but is applicable to any type of semiconductor device including capacitive elements. Further, the invention is not limited to those devices employed in memory arrays or the particular mirrored surface arrangement disclosed.

What is claimed is:

1. A semiconductor device comprising:
    a charge carrier region;
    means, comprising at least one pair of mirror surfaces formed in a substrate of said semiconductor device, for providing an optical path through said charge carrier region, said path being through a longest dimension of said charge carrier region;
    means for applying a write beam to said optical path, said write beam having a wavelength within an absorption band of said semiconductor device;
    means for applying a read beam to said optical path, said read beam having a wavelength outside said absorption band of said semiconductor device; and
    means for detecting at least one of a phase or polarization change after said read beam passes through said charge carrier region.

2. A semiconductor device comprising:
    a. a substrate having a surface;
    b. a source region and a drain region formed in said substrate;
    c. a carrier region adjacent to said surface and located between said source region and said drain region;
    d. means, including a plurality of mirror surfaces formed in said substrate, for providing an optical path through a dimension of said carrier region along a direction between said source and drain regions;
    e. means for applying a write beam to said optical path, said write beam having a wavelength within an absorption band of said substrate;
    f. means for applying a read beam to said optical path, said read beam having a wavelength outside said absorption band of said substrate; and
    g. means for detecting at least one of a phase or polarization change after said read beam passes through said carrier region.

3. A semiconductor device as claimed in claim 2, wherein at least one mirror surface is located adjacent said source region and at least one mirror surface is located adjacent said drain region.

4. A semiconductor device comprising:
    a. a substrate;
    b. a charge carrier region adjacent a surface of said substrate;
    c. a plurality of mirror surfaces formed in said substrate and positioned to provide an optical path through a dimension of said charge carrier region parallel to said surface;
    d. means for applying a write beam to said plurality of mirror surfaces, said write beam having a wavelength within an absorption band of said substrate;
    e. means for applying a read beam to said plurality of mirror surfaces, said read beam having a wavelength outside said absorption band of said substrate; and
    f. means for detecting at least one of a phase or polarization change after said read beam passes through said charge carrier region.

5. A semiconductor device comprising:
    at least one charge carrier region;
    means, comprising at least one pair of mirror surfaces formed in a substrate of said semiconductor device, for providing an optical path through a dimension of said charge carrier region at least approximately parallel to a top surface of said substrate;

means for applying a write beam to said optical path, said write beam having a wavelength within an absorption band of said semiconductor device;

means for applying a read beam to said optical path, said read beam having a wavelength outside said absorption band of said semiconductor device; and means for detecting at least one of a phase or polarization change after said read beam passes through said charge carrier region.

6. A semiconductor device comprising:
a. a substrate having a top surface;
b. a source region and a drain region formed in said substrate;
c. a carrier region adjacent to said top surface and located between said source region and said drain region;
d. means, including a plurality of mirror surfaces formed in said substrate, for providing an optical path through a dimension of said carrier region at least approximately parallel to said top surface of said substrate;
e. means for applying a write beam to said optical path, said write beam having a wavelength within an absorption band of said substrate;
f. means for applying a read beam to said optical path, said read beam having a wavelength outside said absorption band of said substrate; and
g. means for detecting at least one of a phase or polarization change after said read beam passes through said carrier region.

7. A semiconductor device as claimed in claim 6, wherein at least one mirror surface is located adjacent said source region and at least one mirror surface is located adjacent said drain region.

* * * * *